US012655370B2

(12) United States Patent
Ryzhii et al.

(10) Patent No.: US 12,655,370 B2
(45) Date of Patent: Jun. 16, 2026

(54) METAL RESIDUE REMOVING LIQUID, METAL RESIDUE REMOVING METHOD, AND METAL WIRING MANUFACTURING METHOD

(71) Applicant: TOKYO OHKA KOGYO CO., LTD., Kawasaki (JP)

(72) Inventors: Ivan Ryzhii, Kawasaki (JP); Mai Sugawara, Kawasaki (JP); Yugeng Wu, Kawasaki (JP)

(73) Assignee: TOKYO OHKA KOGYO CO., LTD., Kawasaki (JP)

( * ) Notice: Subject to any disclaimer, the term of this patent is extended or adjusted under 35 U.S.C. 154(b) by 229 days.

(21) Appl. No.: 18/460,451

(22) Filed: Sep. 1, 2023

(65) Prior Publication Data

US 2024/0117280 A1 Apr. 11, 2024

(30) Foreign Application Priority Data

Sep. 16, 2022 (JP) ................................. 2022-148036
Apr. 5, 2023 (JP) ................................. 2023-061457

(51) Int. Cl.

| | |
|---|---|
| ***C11D 7/10*** | (2006.01) |
| ***C11D 7/32*** | (2006.01) |
| ***C11D 7/50*** | (2006.01) |
| ***H05K 3/02*** | (2006.01) |
| ***H05K 3/26*** | (2006.01) |

(52) U.S. Cl.

CPC .............. *C11D 7/10* (2013.01); *C11D 7/3209* (2013.01); *C11D 7/3236* (2013.01); *C11D 7/5013* (2013.01); *H05K 3/02* (2013.01); *H05K 3/26* (2013.01); *C11D 2111/22* (2024.01); *H05K 2203/0766* (2013.01)

(58) Field of Classification Search

CPC ....... C11D 7/10; C11D 7/3209; C11D 7/3236; C11D 7/5013; C11D 2111/22; C11D 7/3263; H05K 3/02; H05K 3/26; H05K 2203/0766; H05K 3/067

See application file for complete search history.

(56) References Cited

U.S. PATENT DOCUMENTS

| | | | | |
|---|---|---|---|---|
| 5,962,385 | A * | 10/1999 | Maruyama ........ | H01L 21/02071 510/505 |
| 6,514,352 | B2 * | 2/2003 | Gotoh .................. | C11D 7/5013 257/E21.252 |
| 2003/0114014 | A1 | 6/2003 | Yokoi et al. | |
| 2004/0029753 | A1 * | 2/2004 | Ikemoto ................... | C11D 7/10 134/2 |
| 2005/0032659 | A1 * | 2/2005 | Shirota ............. | H01L 21/31133 257/E21.255 |
| 2005/0089489 | A1 * | 4/2005 | Carter ...................... | C11D 7/08 134/2 |
| 2016/0010035 | A1 * | 1/2016 | Liu .................. | H01L 21/02068 510/175 |
| 2017/0015955 | A1 * | 1/2017 | Oie .......................... | C11D 7/12 |
| 2023/0039366 | A1 * | 2/2023 | Hayashi ............... | C11D 7/5013 |
| 2023/0314955 | A1 * | 10/2023 | Chuang ................ | C11D 7/5013 430/329 |
| 2024/0392194 | A1 * | 11/2024 | Chang .................... | C11D 7/261 |

FOREIGN PATENT DOCUMENTS

| | | |
|---|---|---|
| JP | B-3403187 | 5/2003 |

* cited by examiner

*Primary Examiner* — Binh X Tran
*Assistant Examiner* — Christopher Remavege
(74) *Attorney, Agent, or Firm* — KNOBBE, MARTENS, OLSON & BEAR, LLP

(57) ABSTRACT

A metal residue removing liquid including a mixed solvent containing a first organic solvent and a second organic solvent, a salt of a base containing no metal ions and hydrofluoric acid, and water, in which the first organic solvent is diethylformamide, and the mixed solvent has a value of 0.6 or more, which is obtained by subtracting a hydrogen bond term of a Hansen solubility parameter from a polar term of the Hansen solubility parameter.

9 Claims, No Drawings

METAL RESIDUE REMOVING LIQUID, METAL RESIDUE REMOVING METHOD, AND METAL WIRING MANUFACTURING METHOD

BACKGROUND OF THE INVENTION

Field of the Invention

The present invention relates to a metal residue removing liquid, a metal residue removing method, and a metal wiring manufacturing method.

Priority is claimed on Japanese Patent Application No. 2022-148036 filed Sep. 16, 2022 and Japanese Patent Application No. 2023-061457 filed Apr. 5, 2023, the contents of which are incorporated herein by reference.

Description of Related Art

In the manufacture of semiconductor elements and liquid crystal display elements, a conductive metal film is subjected to etching treatment by using a resist film or the like as a mask to form a wiring pattern. As the density of integrated circuits increases, dry etching, which enables higher-density fine etching, has become the mainstream.

Metal residues including metal oxides and the like adhere to a substrate after a conductive metal film has been subjected to dry etching. In a case in which these metal residues are not removed, a problem such as a decrease in the yield of semiconductor manufacturing occurs.

As a removing liquid for metal residues, a liquid containing a fluorine compound and N-methyl-2-pyrrolidone (NMP) has been used in the related art. For example, Japanese Patent No. 3403187 discloses an anticorrosive agent containing ammonium fluoride, NMP, a mercapto group, and water as a photoresist stripper that is capable of stripping photoresist and removing etching residues.

SUMMARY OF THE INVENTION

In recent years, it has been pointed out that NMP is harmful to the human body, and regulations on NMP have been tightened in various countries. Therefore, it is necessary to replace NMP-containing products with NMP-free products. As for the metal residue removing liquid, it is required to develop a product that does not contain NMP.

In addition, in order to use an NMP-free product as a substitute for the conventional product containing NMP, the NMP-free product preferably has a metal residue removing ability equal to or higher than that of the conventional product.

The present invention has been made in view of the above circumstances, and an object of the present invention is to provide a metal residue removing liquid that has a favorable metal residue removing ability and does not contain NMP, a metal residue removing method using the metal residue removing liquid, and a metal wiring manufacturing method.

In order to solve the above problem, the present invention has adopted the following configuration.

A first aspect of the present invention is a metal residue removing liquid including a mixed solvent (S0) that contains a first organic solvent (S1) and a second organic solvent (S2), a salt (F) of a base containing no metal ions and hydrofluoric acid, and water, in which the first organic solvent (S1) is diethylformamide, and the mixed solvent (S0) is a mixed solvent having a value of 0.6 or more, which is obtained by subtracting a hydrogen bond term (δH) of a Hansen solubility parameter from a polar term (δP) of a Hansen solubility parameter.

A second aspect of the present invention is a metal residue removing method including a step of bringing the metal residue removing liquid according to the first aspect into contact with a process object.

A third aspect of the present invention is a metal wiring manufacturing method including a step of etching a metal layer of a substrate that includes the metal layer to form metal wiring, and a step of bringing the metal residue removing liquid according to the first aspect into contact with the substrate that has been etched.

According to the present invention, the metal residue removing liquid that has a favorable metal residue removing ability and does not contain NMP, the metal residue removing method using the metal residue removing liquid, and the metal wiring manufacturing method are provided.

DETAILED DESCRIPTION OF THE INVENTION (Metal Residue Removing Liquid)

A metal residue removing liquid according to a first aspect of the present invention includes a mixed solvent (S0) containing a first organic solvent (S1) and a second organic solvent (S2), a salt (F) of a base containing no metal ions and hydrofluoric acid, and water. The first organic solvent (S1) is diethylformamide. The mixed solvent (S0) is a mixed solvent having a value of 0.6 or more, which is obtained by subtracting a Hansen solubility parameter (δH) from a Hansen solubility parameter (δP).

<Mixed Solvent (S0)>

The mixed solvent (S0) (hereinafter, also referred to as an "(S0) component") contains the first organic solvent (S1) and the second organic solvent (S2).

<<First Organic Solvent (S1)>>

The first organic solvent (S1) (hereinafter, also referred to as an "(S1) component") is diethylformamide More specifically, the first organic solvent (S1) is N,N-diethylformamide (DEF).

The content of the (S1) component in the metal residue removing liquid of the present embodiment is preferably 40% to 70% by mass, and more preferably 50% to 65% by mass, with respect to the total mass of the metal residue removing liquid.

<<Second Organic Solvent (S2)>>

The second organic solvent (S2) (hereinafter, also referred to as an "(S2) component") is an organic solvent other than the (S1) component. As the (S2) component, an organic solvent that is miscible with other components can be used, but the (S2) component is not particularly limited thereto. The (S2) component is preferably a water-soluble organic solvent. Specific examples of the (S2) component include sulfoxides such as dimethylsulfoxide; sulfones such as dimethylsulfone, diethylsulfone, bis(2-hydroxyethyl)sulfone, and tetramethylenesulfone; amides such as N,N-dimethylformamide, N-methylformamide, N,N-dimethylacetamide, N-methylacetamide, and N,N-diethylacetamide; lactams such as 2-pyrrolidone, N-ethyl-2-pyrrolidone, N-propyl-2-pyrrolidone, N-hydroxymethyl-2-pyrrolidone, and N-hydroxyethyl-2-pyrrolidone; imidazolidinones such as 1,3-dimethyl-2-imidazolidinone, 1,3-diethyl-2-imidazolidinone, and 1,3-diisopropyl-2-imidazolidinone; glycols such as ethylene glycol, diethylene glycol, triethylene glycol, and tetraethylene glycol, propylene glycol; glycol ethers such as ethylene glycol monomethyl ether, ethylene glycol monoethyl ether, ethylene glycol monobutyl ether, diethylene glycol monoethyl ether, diethylene glycol monomethyl ether, diethylene glycol monobutyl ether, propylene glycol monomethyl ether, propylene glycol monoethyl ether, propylene glycol monopropyl ether, and propylene glycol monobutyl ether; esters of glycol ethers such as ethylene glycol monomethyl ether acetate and ethylene glycol monoethyl ether acetate; imidazoles such as 1-methylimidazole, 2-methylimidazole, and 2-propylimidazole; and alcohols such as methanol, ethanol, 1-propanol, 2-propanol, 1-butanol, and 2-butanol.

Among these, sulfoxides, lactams, glycols, imidazoles, and alcohols are preferable, and dimethylsulfoxide, ethylene glycol, diethylene glycol, triethylene glycol, tetraethylene glycol, propylene glycol, 1-methylimidazole, and methanol are more preferable.

The component (S2) may be used alone or in combination of two or more kinds thereof.

The content of the (S2) component in the metal residue removing liquid of the present embodiment is preferably 10% to 30% by mass, and more preferably 10% to 20% by mass, with respect to the total mass of the metal residue removing liquid.

<<Hansen Solubility Parameter (HSP) of Mixed Solvent (S0)>>

The (S0) component is a mixed solvent having a value of 0.6 or more, which is obtained by subtracting a hydrogen bond term (δH) of a Hansen solubility parameter from a polar term (δP) of a Hansen solubility parameter.

The Hansen solubility parameter can be calculated from predetermined parameters based, for example, on solubility parameters and aggregation properties as described by Charles Hansen in Charles M. Hansen, "Hansen Solubility Parameters: A User's Handbook", CRC Press (2007) and "The CRC Handbook and Solubility Parameters and Cohesion Parameters," edited by Allan F. M. Barton (1999).

The Hansen solubility parameter is theoretically calculated as a numerical constant and is a useful tool for predicting the ability of a solvent material to dissolve a particular solute.

The Hansen solubility parameters can be a measure of the overall strength and selectivity of a material by combining the following three experimentally and theoretically derived Hansen solubility parameters (that is, δD, δP, and δH). The units for the Hansen solubility parameter are given in $MPa^{0.5}$ or $(J/cc)^{0.5}$.

δD: Energy derived from intermolecular dispersion force (dispersion term)

δP: Energy derived from intermolecular polar force (polar term)

δH: Energy derived from intermolecular hydrogen bond force (hydrogen bond term)

The "Hansen Solubility Parameter" in each organic solvent can be calculated by, for example, software such as "Molecular Modeling Pro" software, version 5.1.9 (ChemSW, Fairfield CA, www.chemsw.com), Hansen Solubility from Dynacomp Software, or HSPiP (pirika.com).

The Hansen solubility parameters ($\delta D_0$, $\delta P_0$, $\delta H_0$) of the (S0) component can be calculated by the following formulae (1) to (3) in a case in which a mixed volume ratio of the (S1) component to the (S2) component is a:b (S1:S2=a:b).

$$\delta D_0 = (a * \delta D_1 + b * \delta D_2) / (a + b) \quad (1)$$

$$\delta D_0 = (a * \delta P_1 + b * \delta P_2) / (a + b) \quad (2)$$

$$\delta H_0 = (a * \delta H_1 + b * \delta H_2) / (a + b) \quad (3)$$

$\delta D_0$, $\delta P_0$, and $\delta H_0$ indicate Hansen solubility parameters of the (S0) component.

$\delta D_1$, $\delta P_1$, and $\delta H_1$ indicate Hansen solubility parameters of the (S1) component.

$\delta D_2$, $\delta P_2$, and $\delta H_2$ indicate Hansen solubility parameters of the (S2) component.

In a case in which the (S2) component contains two or more kinds of organic solvents, the Hansen solubility parameters of the (S0) component can also be calculated by using the volume ratio of each organic solvent in the same manner as in Formulae (1) to (3).

The (S0) component has a value ($\delta P_0$-$\delta H_0$) of 0.6 or more, which is obtained by subtracting the hydrogen bond term ($\delta H_0$) of the Hansen solubility parameter from the polar term ($\delta P_0$) of the Hansen solubility parameter. ($\delta P_0$-$\delta H_0$) is preferably 0.7 or more from the viewpoint of the metal residue removing performance.

($\delta P_0$-$\delta H_0$) is preferably less than 3.4, more preferably 3.3 or less, still more preferably 3 or less, still more preferably 2.5 or less, still more preferably less than 2.3, and particularly preferably 2.2 or less, from the viewpoint of the metal residue removing performance. Examples of the range of ($\delta P_0$-$\delta H_0$) include 0.6 or more and less than 3.4, 0.6 or more and 3.3 or less, 0.6 or more and 3 or less, 0.6 or more and 2.5 or less, and 0.6 or more and less than 2.3, 0.6 or more and 2.2 or less, and the like.

The dispersion term (ED) of the Hansen solubility parameter of the (S2) component is, for example, preferably 10 to 25, more preferably 10 to 20, still more preferably 12 to 20, and particularly preferably 14 to 20.

The polar term (δP) of the Hansen solubility parameter of the (S2) component is, for example, preferably 5 to 25, more preferably 5 to 20, still more preferably 7 to 18, and particularly preferably 8 to 17.

The hydrogen bond term (δH) of the Hansen solubility parameter of the (S2) component is, for example, preferably 5 to 30, more preferably 5 to 25, still more preferably 7 to 24, and particularly preferably 8 to 23.

In a case in which the Hansen solubility parameters of the (S2) component are within the above preferable range, it is easy to prepare the (S0) component with ($\delta P_0$-$\delta H_0$) of 0.6 or more.

The volume ratio (S1:S2) of the (S1) component to the (S2) component in the (S0) component is, for example, preferably 40:60 to 95:5, more preferably 50:50 to 90:10, still more preferably 60:40 to 90:10, still more preferably 65:35 to 85:15, and particularly preferably 70:30 to 85:15. In a case in which the volume ratio (S1:S2) of the (S1) component to the (S2) component is within the above preferable range, it is easy to prepare the (S0) component with ($\delta P_0$-$\delta H_0$) of 0.6 or more.

The dispersion term (ED) of the Hansen solubility parameter of the (S0) component is, for example, preferably 8 to 25, more preferably 10 to 20, still more preferably 12 to 15, and particularly preferably 12 to 14.

The polar term (δP) of the Hansen solubility parameter of the (S0) component is, for example, preferably 5 to 20, more preferably 6 to 15, still more preferably 7 to 12, and particularly preferably 8 to 10.

The hydrogen bond term (δH) of the Hansen solubility parameter of the (S0) component is, for example, preferably 5 to 15, more preferably 5 to 12, still more preferably 7 to 10, and particularly preferably 7 to 9.

In a case in which the Hansen solubility parameters of the (S0) component are within the above-described preferable ranges, the metal residue removing performance is likely to be improved.

The content of the (S0) component in the metal residue removing liquid of the present embodiment is preferably 30% by mass or more, more preferably 50% by mass or more, still more preferably 60% by mass or more, and particularly preferably 70% by mass or more with respect to the total mass of the metal residue removing liquid. The content of the (S0) component in the metal residue removing liquid of the present embodiment is preferably 95% by mass or less, more preferably 90% by mass or less, still more preferably 85% by mass or less, and particularly preferably 80% by mass or less with respect to the total mass of the metal residue removing liquid. Examples of the content of the (S0) component in the metal residue removing liquid of the present embodiment include 30% to 95% by mass, 50% to 90% by mass, 60% to 85% by mass, 70% to 80% by mass, 70% to 75% by mass, and the like with respect to the total mass of the metal residue removing liquid. In a case in which the content of the (S0) component is within the above-described preferable ranges, the metal residue removing performance is likely to be improved.

<Salt (F) of Base Containing No Metal Ions and Hydrofluoric Acid>

The metal residue removing liquid of the present embodiment contains a salt (hereinafter, also referred to as an "(F) component") of a base that contains no metal ions and hydrofluoric acid. The base that forms a salt with the hydrofluoric acid (HF) may be any base that contains no metal ions. "A base that contains no metal ions" is a base that contains no metal ions in its molecule. Specific examples of the base that contains no metal ions include hydroxylamines; organic amines such as aliphatic amines, alicyclic amines, aromatic amines, and heterocyclic amines; ammonia; alkanolamines; and quaternary hydroxides, and the like. The base that contains no metal ions may be a base selected from the group consisting of hydroxylamines, aliphatic amines, alicyclic amines, aromatic amines, heterocyclic amines, ammonia, alkanolamines, and quaternary hydroxides.

Examples of the hydroxylamines include hydroxylamine ($NH_2OH$), N-methylhydroxylamine, N,N-dimethylhydroxylamine, and N,N-diethylhydroxylamine Examples of primary aliphatic amines include monoethanolamine, ethylenediamine, 2-(2-aminoethylamino)ethanol, and the like.

Examples of secondary aliphatic amines include diethanolamine, N-methylaminoethanol, dipropylamine, 2-ethylaminoethanol, and the like.

Examples of tertiary aliphatic amines include dimethylaminoethanol, ethyldiethanolamine, and the like.

Examples of alicyclic amines include cyclohexylamine, dicyclohexylamine, and the like.

Examples of aromatic amines include benzylamine, dibenzylamine, N-methylbenzylamine, and the like.

Examples of heterocyclic amines include pyrrole, pyrrolidine, pyrrolidone, pyridine, morpholine, pyrazine, piperidine, N-hydroxyethylpiperidine, oxazole, thiazole, and the like.

Examples of alkanolamines include monoethanolamine, diethanolamine, triethanolamine, 2-(2-aminoethoxy)ethanol, N,N-dimethylethalamine, N,N-diethylethanolamine, N,N-dibutylethanolamine, N-methylethanolamine, N-ethylethanolamine, N-butylethanolamine, N-methyldiethanolamine, monoisopropanolamine, diisopropanolamine, triisopropanolamine, and the like.

Examples of quaternary hydroxides include a compound represented by General Formula (b1).

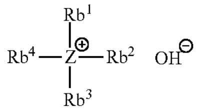

(b1)

[In the formula, $Rb^1$ to $Rb^4$ each independently represents a hydrocarbon group which may have a substituent; and Z represents a nitrogen atom or a phosphorus atom.]

In Formula (b1), $Rb^1$ to $Rb^4$ each independently represents a hydrocarbon group which may have a substituent. The hydrocarbon group preferably has 1 to 10 carbon atoms, and more preferably has 1 to 6 carbon atoms.

The hydrocarbon group which may have a substituent in $Rb^1$ to $Rb^4$ may be an aliphatic hydrocarbon group which may have a substituent or an aromatic hydrocarbon group which may have a substituent.

The aliphatic hydrocarbon group may be a saturated aliphatic hydrocarbon group or an unsaturated aliphatic hydrocarbon group. The aliphatic hydrocarbon group may be linear or branched, and may include a ring structure.

Examples of the linear aliphatic hydrocarbon group include a linear alkyl group having 1 to 10 carbon atoms, and the linear aliphatic hydrocarbon group preferably has 1 to 8 carbon atoms, more preferably has 1 to 6 carbon atoms, still more preferably has 1 to 4 carbon atoms or 1 to 3 carbon atoms, and particularly preferably has 1 or 2 carbon atoms. Specific examples thereof include a methyl group, an ethyl group, an n-propyl group, an n-butyl group, and an n-pentyl group.

Examples of the branched aliphatic hydrocarbon group include a branched alkyl group having 3 to 10 carbon atoms, and the branched aliphatic hydrocarbon group preferably has 3 to 8 carbon atoms, more preferably has 3 to 6 carbon atoms, and still more preferably has 3 or 4 carbon atoms. Specific examples thereof include an isopropyl group, an isobutyl group, a tert-butyl group, an isopentyl group, a neopentyl group, a 1,1-diethylpropyl group, and a 2,2-dimethylbutyl group.

The aliphatic hydrocarbon group including a ring structure is an aliphatic hydrocarbon group including an alicyclic group. The alicyclic group may be either a monocyclic group or a polycyclic group.

Examples of the monocyclic aliphatic hydrocarbon groups include a group obtained by removing one hydrogen atom from a monocycloalkane. The monocycloalkane preferably has 3 to 6 carbon atoms. Specific examples of the monocycloalkane include cyclopropane, cyclopentane, and cyclohexane.

Examples of the aliphatic hydrocarbon group of the polycyclic group include a group obtained by removing one hydrogen atom from a polycycloalkane. The polycycloalkane preferably has 7 to 12 carbon atoms. Specific examples of the polycycloalkane include adamantane, norbornane, isobomane, tricyclodecane, and tetracyclododecane.

The aromatic hydrocarbon group is a hydrocarbon group having at least one aromatic ring. The aromatic ring is not particularly limited as long as it is a cyclic conjugated system having 4n+2 π electrons, and may be monocyclic or polycyclic. The aromatic ring preferably has 5 to 30 carbon atoms, more preferably has 5 to 20 carbon atoms, still more preferably has 6 to 15 carbon atoms, and particularly preferably has 6 to 12 carbon atoms.

Specific examples of the aromatic ring include aromatic hydrocarbon rings such as benzene, naphthalene, anthracene, and phenanthrene; and an aromatic heterocyclic ring obtained by substituting a part of carbon atoms constituting the above-described aromatic hydrocarbon ring with a hetero atom. Examples of the hetero atom in the aromatic heterocyclic rings include an oxygen atom, a sulfur atom, and a nitrogen atom. Specific examples of the aromatic heterocyclic ring include a pyridine ring and a thiophene ring.

Specific examples of the aromatic hydrocarbon group include a group (an aryl group or a heteroaryl group) obtained by removing one hydrogen atom from the aromatic hydrocarbon ring or the aromatic heterocyclic ring; a group obtained by removing one hydrogen atom from an aromatic compound including two or more aromatic rings (for example, biphenyl and fluorene); and a group obtained by substituting one of the hydrogen atoms of the aromatic hydrocarbon ring or the aromatic heterocyclic ring with an alkylene group (for example, arylalkyl groups such as a benzyl group, a phenethyl group, a 1-naphthylmethyl group, a 2-naphthylmethyl group, a 1-naphthylethyl group, and a 2-naphthylethyl group). The alkylene group bonded to the aromatic hydrocarbon ring or the aromatic heterocyclic ring preferably has 1 to 4 carbon atoms, more preferably has 1 to 3 carbon atoms, and particularly preferably has 1 carbon atom.

The hydrocarbon group in $Rb^1$ to $Rb^4$ may have a substituent. The substituent is not particularly limited, but examples thereof include a hydroxy group, an alkyl group, and a vinyl group. It should be noted that the substituent includes no carbonyl group.

$Rb^1$ and $Rb^4$ are each preferably an aliphatic hydrocarbon group which may have a substituent, or a hydrogen atom, more preferably a linear or branched alkyl group which may have a substituent, or the hydrogen atom, and still more preferably a linear or branched hydroxyalkyl group, a linear or branched hydroxyalkyl group, or the hydrogen atom. The linear hydroxyalkyl group or the linear alkyl group preferably has 1 to 6 carbon atoms, more preferably has 1 to 3 carbon atoms, and still more preferably has 1 or 2 carbon atoms. The branched hydroxyalkyl group or the linear alkyl group preferably has 3 to 6 carbon atoms, and more preferably has 3 carbon atoms.

In Formula (b1), Z represents a nitrogen atom or a phosphorus atom.

In a case in which the quaternary hydroxide is a quaternary amine hydroxide, specific examples thereof include tetramethylammonium hydroxide (TMAH), tetraethylammonium hydroxide, tetrapropylammonium hydroxide, tetrabutylammonium hydroxide, monomethyltripropylammonium hydroxide, trimethylethylammonium hydroxide, (2-hydroxyethyl)trimethylammonium hydroxide, (2-hydroxyethyl)triethylammonium hydroxide, (2-hydroxyethyl) tripropylammonium hydroxide, (1-hydroxypropyl)trimethylammonium hydroxide, choline, and the like.

In a case in which the quaternary hydroxide is a quaternary phosphonium hydroxide, specific examples thereof include tetrabutylphosphonium hydroxide, tetrapropylphosphonium hydroxide, tetraethylphosphonium hydroxide, tetramethylphosphonium hydroxide, tetraphenylphosphonium hydroxide, methyltriphenylphosphonium hydroxide, ethyltriphenylphosphonium hydroxide, propyltriphenylphosphonium hydroxide, butyltriphenylphosphonium hydroxide, benzyltriphenylphosphonium hydroxide, allyltriphenylphosphonium hydroxide, dodecyltriphenylphosphonium hydroxide, tetradecyltriphenylphosphonium hydroxide, hexadecyltriphenylphosphonium hydroxide, and hexadecyltributylphosphonium hydroxide.

Among these bases, ammonia, monoethanolamine, N-methylaminoethanol, tetramethylammonium hydroxide, (2-hydroxyethyl)trimethylammonium hydroxide, and the like are preferably used from the viewpoint of availability, safety, and the like.

As the base that contains no metal ions, one kind may be used alone, or two or more kinds may be used in combination.

The salt ((F) component) of a base that contains no metal ions and hydrofluoric acid can be produced by addition of the base that contains no metal ions to a commercially available hydrofluoric acid having a hydrogen fluoride concentration of 50% to 60%. Specific examples of the (F) component include ammonium fluoride ($NH_4F$), tetramethylammonium fluoride (TMAF), and the like.

The (F) component may be used alone or in combination of two or more kinds thereof.

In a case in which ammonium fluoride is used as the (F) component, it is preferable to use ammonium fluoride in combination with a quaternary hydroxide or an alkanolamine, and more preferable to use ammonium fluoride in combination with a quaternary amine hydroxide. For example, ammonium fluoride and TMAF can be used in combination. In a case in which ammonium fluoride is used in combination with a quaternary hydroxide or an alkanolamine, a blending ratio of ammonium fluoride to a quaternary hydroxide or an alkanolamine can be set as, for example, ammonium fluoride:quaternary hydroxide or alkanolamine=2:8 to 8:2 (mass ratio), and 3:7 to 7:3 is preferable. In a case in which the blending ratio is set within the above-described range, corrosion of metal wiring can be prevented. The metal residue removing liquid of the present embodiment may not contain ammonium fluoride and a fluorine compound other than TMAF. The metal residue removing liquid of the present embodiment may not contain a salt of a base containing metal ions and hydrofluoric acid.

The content of the (F) component in the metal residue removing liquid of the present embodiment is preferably 0.1% to 10% by mass, more preferably 0.2% to 5% by mass, still more preferably 0.5% to 3% by mass, and particularly preferably 0.5% to 1% by mass with respect to the total mass of the metal residue removing liquid. In a case in which the content of the (F) component is within the above-described preferable range, corrosion of metal wiring is prevented, and the metal residue removing performance is improved.

<Water>

The metal residue removing liquid of the present embodiment contains water as a solvent. The water may contain trace components which are unavoidably incorporated. The water used in the metal residue removing liquid of the present embodiment is preferably water that has been subjected to a purification treatment, such as distilled water, ion exchange water, and ultrapure water, and ultrapure water generally used in the production of a semiconductor is more preferably used.

The content of water in the metal residue removing liquid of the present embodiment is, but not particularly limited to, preferably 5% by mass or more, more preferably 10% by mass or more, still more preferably 15% by mass or more, and particularly preferably 20% by mass or more. The upper limit value of the content of water in the metal residue removing liquid of the present embodiment is, but not particularly limited to, preferably 70% by mass or less, more preferably 50% by mass or less, still more preferably 40% by mass or less, and particularly preferably 30% by mass or less. Examples of the content of the water in the metal residue removing liquid of the present embodiment include 5% to 70% by mass, 10% to 50% by mass, 15% to 40% by mass, 20% to 30% by mass, 25% to 30% by mass, and the like with respect to the total volume of the metal residue removing liquid.

<Optional Component>

The metal residue removing liquid of the present embodiment may contain an optional component in addition to the above component. Examples of the optional component include an anticorrosive agent, a surfactant, hydrofluoric acid, and other components.

<<Anticorrosive Agent>>

The anticorrosive agent is not particularly limited, but an anticorrosive agent made of a compound containing a mercapto group (mercapto group-containing anticorrosive agent) is preferable. The mercapto group-containing anticorrosive agent is not particularly limited as long as it can prevent corrosion of metals used for the wiring (for example, Al wiring and Cu wiring). The mercapto group-containing anticorrosive agent is preferably a compound having a structure in which a hydroxyl group and/or a carboxy group is introduced to at least one of the α-position or the β-position of a carbon atom bonded to the mercapto group. Specific examples of such a compound include 1-thioglycerol, 3-(2-aminophenylthio)-2-hydroxypropyl mercaptan, 3-(2-hydroxyethylthio)-2-hydroxypropyl mercaptan, 2-mercaptopropionic acid, 3-mercaptopropionic acid, and the like. Among these, 1-thioglycerol is preferable.

By using the mercapto group-containing anticorrosive agent, anticorrosion properties for the metal wiring (particularly, Al wiring and Cu wiring) can be improved, and precipitation of the anticorrosive agent can be prevented beforehand.

The anticorrosive agent may be used alone or in combination of two or more kinds thereof. The content of the anticorrosive agent in the metal residue removing liquid of the present embodiment is preferably 0.1% to 10% by mass, more preferably 0.2% to 5% by mass, still more preferably 0.2% to 1% by mass, and particularly preferably 0.3% to 0.8% by mass with respect to the total mass of the metal residue removing liquid, from the viewpoint of anticorrosive properties for the metal wiring. The metal residue removing liquid of the present embodiment may not contain an anticorrosive agent or may not contain an anticorrosive agent other than the mercapto group-containing anticorrosive agent.

<<Surfactant>>

The metal residue removing liquid of the present embodiment may contain a surfactant for the purpose of adjusting wettability and the like. Examples of the surfactant include a nonionic surfactant, an anionic surfactant, a cationic surfactant, and an amphoteric surfactant.

Examples of the nonionic surfactant include polyalkylene oxide alkylphenyl ether-based surfactants, polyalkylene oxide alkyl ether-based surfactants, block polymer-based surfactants consisting of polyethylene oxide and polypropylene oxide, polyoxyalkylene distyrenated phenyl ether-based surfactants, polyalkylene tribenzylphenyl ether-based surfactants, and acetylene polyalkylene oxide-based surfactants.

Examples of the anionic surfactant include alkylsulfonic acids, alkylbenzenesulfonic acids, alkylnaphthalenesulfonic acids, alkyldiphenyl ether sulfonic acids, fatty acid amidosulfonic acids, polyoxyethylene alkyl ether carboxylic acids, polyoxyethylene alkyl ether acetic acids, polyoxyethylene alkyl ether propionic acids, alkyl phosphonic acids, and fatty acid salts. Examples of the "salts" include ammonium salts, sodium salts, potassium salts, and tetramethylammonium salts.

Examples of the cationic surfactant include alkylpyridium-based surfactants.

Examples of the amphoteric surfactant include betaine type surfactants, amino acid type surfactants, imidazoline type surfactants, and amine oxide type surfactants.

These surfactants are generally commercially available. The surfactant may be used alone or in combination of two or more kinds thereof.

In a case where the metal residue removing liquid of the present embodiment contains the surfactant, the content of the surfactant is not particularly limited, but is, for example, preferably 0.0001% by mass to 5% by mass, more preferably 0.0002% by mass to 3% by mass, still more preferably 0.002% by mass to 1% by mass, and particularly preferably 0.002% by mass to 0.2% by mass with respect to the total mass of the metal residue removing liquid. In a case in which the content of the surfactant is within the above-described preferable range, the wettability is likely to be improved.

The metal residue removing liquid of the present embodiment may not contain one or more selected from the group consisting of a nonionic surfactant, an anionic surfactant, a cationic surfactant, and an amphoteric surfactant, and may not contain one or more of the compounds exemplified as the surfactant. The metal residue removing liquid of the present embodiment may not contain a surfactant.

<<Hydrofluoric Acid>>

The metal residue removing liquid of the present embodiment may contain hydrofluoric acid. In a case in which the metal residue removing liquid of the present embodiment contains hydrofluoric acid, the (F) component preferably contains ammonium fluoride.

The content of the (F) component in the metal residue removing liquid of the present embodiment is preferably 0.0001% to 1% by mass, more preferably 0.001% to 0.5% by mass, still more preferably 0.005% to 0.1% by mass, and particularly preferably 0.005% to 0.05% by mass with respect to the total mass of the metal residue removing liquid. In a case in which the content of the (F) component is within the above-described preferable range, corrosion of metal wiring is prevented, and the metal residue removing performance is improved.

The metal residue removing liquid of the present embodiment may not contain hydrofluoric acid.

<Impurities and Other Substances>

The metal residue removing liquid of the present embodiment may contain metal impurities including metal atoms such as Fe atoms, Cr atoms, Ni atoms, Zn atoms, Ca atoms, Pb atoms, or other atoms. The total content of the metal atoms in the metal residue removing liquid of the present embodiment is preferably equal to or smaller than 100 ppt by mass with respect to the total mass of the metal residue removing liquid. The lower limit value of the total content of the metal atoms is preferably as low as possible, and the lower limit value may be, for example, 0.001 ppt by mass or more. Examples of the total content of the metal atoms include 0.001 ppt by mass to 100 ppt by mass. By setting the total content of the metal atoms to equal to or smaller than the preferable upper limit value, a property of preventing defects and a property of preventing residues of the metal residue removing liquid are improved. By setting the total content of the metal atoms to equal to or greater than the preferable lower limit value, it is believed that the metal atoms are less likely to exist in isolation in the system, thereby less likely to adversely affect the production yield of all of objects subjected to rinsing.

The content of the metal impurities can be adjusted by, for example, purification processing such as filtering. The purification processing such as filtering may be carried out on some or all of the raw materials before preparing the metal residue removing liquid, or may be carried out after the metal residue removing liquid is prepared.

The metal residue removing liquid of the present embodiment may contain, for example, organic-derived impurities (organic impurities). The total content of the organic impurities in the metal residue removing liquid of the present embodiment is preferably equal to or smaller than 5,000 ppm by mass. The lower limit of the content of the organic impurities is preferably as low as possible, and the lower limit value may be, for example, 0.1 ppm by mass or more. The total content of the organic impurities is, for example, 0.1 ppm by mass to 5000 ppm by mass.

The metal residue removing liquid of the present embodiment may contain, for example, objects to be counted having a size counted by a light scattering liquid-borne particle counter. The size of the objects to be counted is, for example, 0.04 μm or more. The number of the objects to be counted in the metal residue removing liquid of the present embodiment is, for example, 1,000 per 1 mL of the metal residue removing liquid or less, and the lower limit value is, for example, 1 or more.

The organic impurities and/or the objects to be counted may be added to the metal residue removing liquid, or may be unavoidably incorporated into the metal residue removing liquid during a step of producing the metal residue removing liquid. Examples of the case where the organic impurities are unavoidably incorporated in the step of producing the metal residue removing liquid include a case in which organic impurities are contained in raw materials (for example, organic solvents) used in the step of producing the metal residue removing liquid, and a case in which organic impurities in an external environment are incorporated (for example, contamination) in the step of producing the metal residue removing liquid, but not limited to the above. In a case in which the objects to be counted are added to the metal residue removing liquid, an abundance ratio may be adjusted for each specific size in consideration of a surface roughness of a rinsing target.

The organic solvent (organic solvent (S1) and organic solvent (S2)) used in the metal residue removing liquid of the present embodiment may be purified by a known method. A method of purifying an organic solvent is not particularly limited, and a known method can be used. Examples of the method of purifying an organic solvent include distillation purification. The organic solvent may be treated with filtration with a filter, an ion exchange resin, or the like in order to reduce metal impurities, organic impurities, and other impurities. In order to reduce metal impurities, for example, treatment with chelate filter filtration, an ion exchange resin, or the like can be carried out. In order to remove particulate impurities, for example, a polyethylene filter, a polypropylene filter, a polytetrafluoroethylene filter, a nylon filter, a polyimide filter, a polyamideimide filter, a polyamide filter, or other filters can be used.

The purity of the organic solvent is preferably 99% or more, more preferably 99.5% or more, and still more preferably 99.9% or more.

<Storage Container>

A method of storing the metal residue removing liquid of the present embodiment is not particularly limited, and known storage containers in the related art can be used. In order to ensure the stability of the metal residue removing liquid, a porosity in the container when the rinsing solution is stored in the container, and/or the type of gas with which voids are filled may be appropriately set. For example, the porosity in the storage container is about 0.01% to 30% by volume.

In one embodiment, the metal residue removing liquid of the present embodiment may not contain an amine compound. In one embodiment, the metal residue removing liquid of the present embodiment may not contain a polyamine compound. In one embodiment, the metal residue removing liquid of the present embodiment may not contain a tertiary polyamine compound. In one embodiment, the metal residue removing liquid of the present embodiment may not contain an amide compound other than diethylformamide. The metal residue removing liquid of the present embodiment does not contain NMP.

The metal residue removing liquid of the present embodiment can be used to remove a metal residue generated after etching a metal. The metal residue preferably contains at least one selected from the group consisting of aluminum, copper, titanium, nickel, ruthenium, tungsten, cobalt, and oxides thereof. Examples of the metal include, but are not limited to, aluminum, copper, titanium, nickel, ruthenium, tungsten, cobalt, and other metals. The metal residue generated after etching includes a metal subjected to etching, a metal oxide of the metal, and the like. By using the metal residue removing liquid of the present embodiment, it is possible to sufficiently remove the metal residue adhering to the substrate after etching treatment.

The metal residue removing liquid of the present embodiment contains, as an organic solvent component, the (S1) component that is diethylformamide and the (S2) component that is an organic solvent other than the (S1) component, and the mixed solvent (S0) having a value (δP-δH) of 0.6 or more, which is obtained by subtracting the hydrogen bond term (δH) of the Hansen solubility parameter from the polar term (δP) of the Hansen solubility parameter. In this manner, the ionization state of the (F) component can be controlled, and appropriate ion species can be generated to efficiently remove the metal residue. Diethylformamide, which is the (S1) component, has poor compatibility with the (F) component when used as a single organic solvent, and causes the (F) component to be separated when mixed with the (F) component. Therefore, by using the (S1) component in combination with the (S2) component, the compatibility with the (F) component is improved, and the metal residue removing performance is improved.

NMP has been contained in a conventional metal residue removing liquid. However, since the harmfulness of NMP to the human body is a problem, restrictions on the use of NMP have increased worldwide. Although the metal residue removing liquid of the present embodiment does not contain NMP, the metal residue removing liquid exhibits the metal residue removing performance equal to or better than that of a metal residue removing liquid using NMP in the related art. Therefore, the metal residue removing liquid of the present embodiment can be suitably used as a product to replace the metal residue removing liquid in the related art.

The metal residue contains a metal oxide ($Al_2O_3$ and the like) as a main component, but also contains a small amount of metals (Al and the like). Therefore, in order to obtain a favorable metal residue removing ability, the metal residue removing liquid preferably has a metal removing ability to some extent as well as a metal oxide removing ability. However, in a case in which the metal removing ability is too high, there is a concern that the metal wiring may be damaged. In order to reduce the risk of damage to the metal wiring while achieving excellent metal residue removing ability, balancing between the metal oxide removing ability and the metal removing ability is important. The metal residue removing liquid of the present embodiment has a large total value of the metal etching amount and the metal oxide etching amount, and a high etching selectivity of the metal oxide with respect to metal, as compared with the conventional product containing NMP. Therefore, it can be said that the metal residue removing liquid of the present embodiment has a high metal residue removing ability and a low risk of damage to the metal wiring, as compared with the conventional product containing NMP.

(Metal Residue Removing Method)

A metal residue removing method according to a second aspect of the present invention includes a step of bringing the metal residue removing liquid according to the first aspect into contact with a process object.

Examples of the process object include a substrate to which a metal residue adheres. Examples of such a substrate include a substrate after etching treatment. Examples of the substrate include a substrate including metal wiring, and the substrate may be a substrate including metal wiring, which is formed by the etching treatment being performed on a metal layer. A metal constituting the metal layer is not particularly limited and may be a metal alone, an alloy, or a metal compound. Examples of the metal compound include a metal oxide, a metal nitride, and a metal oxynitride. Examples of the metal constituting the metal layer include aluminum, copper, titanium, nickel, ruthenium, tungsten, cobalt, and other metals. The metal layer can be formed by a known method, and for example, plating, CVD, ALD, or PVD can be used.

The etching treatment performed on the metal layer can be dry etching. Dry etching of the metal layer can be performed with, for example, an oxygen gas, a chlorine gas, or other gases as an etching gas.

A method of bringing the metal residue removing liquid into contact with the process object is not particularly limited, and any known method can be used. Examples of such a method of bringing the metal residue removing liquid into contact with the process object include a spin coating method, an immersion method (dip method), a spray method, a puddle method, and other methods.

The spin coating method is a method of supplying a metal residue removing liquid to a substrate while rotating the substrate by using a spin coater or the like. Examples of the method of supplying the metal residue removing liquid include a method of spraying a metal residue removing liquid onto a substrate, a method of adding a metal residue removing liquid dropwise onto a substrate, and other methods.

The immersion method (dip method) is a method of immersing a substrate in a metal residue removing liquid.

The spray method is a method of spraying a metal residue removing liquid into a transport space while a substrate is transported in a predetermined direction.

The puddle method is a method of accumulating and retaining the metal residue removing liquid on the substrate by surface tension, and leaving it stationary for a certain period of time.

As the method of bringing the metal residue removing liquid into contact with the substrate surface, a spin coating method is preferable. The spin rotation speed in the spin coating method is, for example, 100 to 5000 rpm, 500 to 3,000 rpm, and 800 to 2,000 rpm.

The contact time of the metal residue removing liquid with the process object can be appropriately set according to the amount of the metal residue. Examples of the contact time include 10 seconds to 30 minutes, 30 seconds to 15 minutes, 1 minute to 10 minutes, and 3 minutes to 5 minutes.

The temperature for metal residue removing treatment may be, for example, 10° C. to 60° C., 15° C. to 50° C., 20° C. to 40° C., or 20° C. to 30° C. The temperature may be room temperature (about 15° C. to 30° C.). By raising the temperature of a treatment liquid, the metal residue removing performance is improved, but the treatment temperature of the metal residue removing liquid can be appropriately selected in consideration of suppression of a change in the composition of the metal residue removing liquid, workability, safety, cost, and the like.

After the metal residue removing treatment, the metal residue removing liquid may be removed from the process object by performing drying, washing, or the like on the process object.

In the metal residue removing method of the present embodiment, the process object is treated with the metal residue removing liquid according to the first aspect. By using the metal residue removing liquid according to the first aspect, it is possible to remove the metal residue adhering to the process object safely and efficiently.

(Metal Wiring Manufacturing Method)

A metal wiring manufacturing method according to a third aspect of the present invention includes a step of etching a metal layer of a substrate including the metal layer to form metal wiring (hereinafter, referred to as a "step (i)") and a step of bringing the metal residue removing liquid according to the first aspect into contact with the substrate that has been etched (hereinafter, referred to as a "step (ii)").

<Step (i)>

In the step (i), the metal layer of the substrate including the metal layer is etched to form metal wiring.

Examples of the substrate include a silicon (Si) substrate, a silicon nitride (SiN) substrate, a silicon oxide film (Ox) substrate, a silicon carbide (SiC) substrate, a tungsten (W) substrate, a tungsten carbide (WC) substrate, a cobalt (Co) substrate, a titanium nitride (TiN) substrate, a tantalum nitride (TaN) substrate, a germanium (Ge) substrate, a silicon germanium (SiGe) substrate, an aluminum (Al) substrate, a nickel (Ni) substrate, a titanium (Ti) substrate, a ruthenium (Ru) substrate, a copper (Cu) substrate, and other substrates.

Using a silicon (Si) substrate as an example, a substrate having a surface on which a silicon oxide film such as a natural oxide film, a thermal oxide film, and a vapor-phase synthetic film (such as a CVD film) is formed may be used, and a substrate having a pattern that is formed on the silicon oxide film may be used.

The substrate includes a metal layer. Examples of the metal layer include those described above, and the metal layer can be formed by a known method as described above. The metal layer is preferably a wiring layer.

The etching performed on the metal layer is preferably dry etching. Dry etching of the metal layer can be performed with an oxygen gas, a chlorine gas, or other gases as an etching gas. Dry etching of the metal layer can be performed using, for example, a resist pattern formed by using a resist composition, a hard mask pattern formed by using a composition for forming a hard mask, or the like as a mask. Etching the metal layer using a resist pattern or the like having a desired pattern as a mask enables the formation of metal wiring having a desired wiring pattern.

<Step (ii)>

In the step (ii), the metal residue removing liquid according to the first aspect is brought into contact with the substrate that has been etched.

The metal residue removing liquid can be brought into contact with the substrate that has been etched in the same manner as described above. By bringing the metal residue removing liquid into contact with the substrate after etching, the metal residue generated due to the etching can be effectively removed.

<Optional Step>

The method of the present embodiment may include optional configurations in addition to the above-described steps. Examples of optional steps include a resist pattern forming step, a resist film stripping step, a dielectric layer forming step, a via forming step, a contact forming step, and the like.

In the method of the present embodiment, the substrate on which the metal wiring has been formed is treated with the metal residue removing liquid according to the first aspect. Therefore, the metal residue generated due to the etching treatment during the formation of the metal wiring can be efficiently removed from the substrate. In addition, since the metal residue removing liquid according to the first aspect does not contain NMP, washing treatment can be safely performed.

EXAMPLES

Hereinafter, the present invention will be described in more detail with reference to Examples, but the present invention is not limited thereto.

Preparation of Metal Residue Removing Liquid

Examples 1 to 8 and Comparative Examples 1 to 25

A metal residue removing liquid in each of Examples shown in Tables 1 to 3 was prepared. In Tables 1 to 3, the numerical values in [ ] indicate % by mass with respect to the total mass of the metal residue removing liquid.

TABLE 1

| | (S) component | (F) component | | (A) component | (B) component | (W) component |
|---|---|---|---|---|---|---|
| Reference Example | NMP [73.65] | $NH_4F$ [0.45] | TMAF [0.30] | Surfact-W [0.10] | 1-ThioG [0.50] | Water [25.00] |
| Comparative Example 1 | (S1)-1 [73.65] | $NH_4F$ [0.45] | TMAF [0.30] | Surfact-W [0.10] | 1-ThioG [0.50] | Water [25.00] |
| Comparative Example 2 | (S1)-2 [73.65] | $NH_4F$ [0.45] | TMAF [0.30] | Surfact-W [0.10] | 1-ThioG [0.50] | Water [25.00] |
| Comparative Example 3 | (S1)-3 [73.65] | $NH_4F$ [0.45] | TMAF [0.30] | Surfact-W [0.10] | 1-ThioG [0.50] | Water [25.00] |
| Comparative Example 4 | (S1)-4 [73.65] | $NH_4F$ [0.45] | TMAF [0.30] | Surfact-W [0.10] | 1-ThioG [0.50] | Water [25.00] |
| Comparative Example 5 | (S1)-5 [73.65] | $NH_4F$ [0.45] | TMAF [0.30] | Surfact-W [0.10] | 1-ThioG [0.50] | Water [25.00] |
| Comparative Example 6 | (S1)-6 [73.65] | $NH_4F$ [0.45] | TMAF [0.30] | Surfact-W [0.10] | 1-ThioG [0.50] | Water [25.00] |
| Comparative Example 7 | (S1)-7 [73.65] | $NH_4F$ [0.45] | TMAF [0.30] | Surfact-W [0.10] | 1-ThioG [0.50] | Water [25.00] |
| Comparative Example 8 | (S1)-8 [73.65] | $NH_4F$ [0.45] | TMAF [0.30] | Surfact-W [0.10] | 1-ThioG [0.50] | Water [25.00] |
| Comparative Example 9 | (S1)-9 [73.65] | $NH_4F$ [0.45] | TMAF [0.30] | Surfact-W [0.10] | 1-ThioG [0.50] | Water [25.00] |

TABLE 2

| | (S) component | (F) component | | (A) component | (B) component | (W) component |
|---|---|---|---|---|---|---|
| Example 1 | (S0)-1 [73.65] | $NH_4F$ [0.45] | TMAF [0.30] | Surfact-W [0.10] | 1-ThioG [0.50] | Water [25.00] |
| Comparative Example 10 | (S1)-10 [73.65] | $NH_4F$ [0.45] | TMAF [0.30] | Surfact-W [0.10] | 1-ThioG [0.50] | Water [25.00] |
| Example 2 | (S0)-2 [73.65] | $NH_4F$ [0.45] | TMAF [0.30] | Surfact-W [0.10] | 1-ThioG [0.50] | Water [25.00] |
| Example 3 | (S0)-3 [73.65] | $NH_4F$ [0.45] | TMAF [0.30] | Surfact-W [0.10] | 1-ThioG [0.50] | Water [25.00] |
| Example 4 | (S0)-4 [73.65] | $NH_4F$ [0.45] | TMAF [0.30] | Surfact-W [0.10] | 1-ThioG [0.50] | Water [25.00] |
| Comparative Example 11 | (S1)-11 [73.65] | $NH_4F$ [0.45] | TMAF [0.30] | Surfact-W [0.10] | 1-ThioG [0.50] | Water [25.00] |
| Example 5 | (S0)-5 [73.65] | $NH_4F$ [0.45] | TMAF [0.30] | Surfact-W [0.10] | 1-ThioG [0.50] | Water [25.00] |
| Comparative Example 12 | (S1)-12 [73.65] | $NH_4F$ [0.45] | TMAF [0.30] | Surfact-W [0.10] | 1-ThioG [0.50] | Water [25.00] |
| Example 6 | (S0)-6 [73.65] | $NH_4F$ [0.45] | TMAF [0.30] | Surfact-W [0.10] | 1-ThioG [0.50] | Water [25.00] |
| Comparative Example 13 | (S1)-13 [73.65] | $NH_4F$ [0.45] | TMAF [0.30] | Surfact-W [0.10] | 1-ThioG [0.50] | Water [25.00] |
| Comparative Example 14 | (S1)-14 [73.65] | $NH_4F$ [0.45] | TMAF [0.30] | Surfact-W [0.10] | 1-ThioG [0.50] | Water [25.00] |
| Comparative Example 15 | (S1)-15 [73.65] | $NH_4F$ [0.45] | TMAF [0.30] | Surfact-W [0.10] | 1-ThioG [0.50] | Water [25.00] |
| Comparative Example 16 | (S1)-16 [73.65] | $NH_4F$ [0.45] | TMAF [0.30] | Surfact-W [0.10] | 1-ThioG [0.50] | Water [25.00] |
| Comparative Example 17 | (S1)-17 [73.65] | $NH_4F$ [0.45] | TMAF [0.30] | Surfact-W [0.10] | 1-ThioG [0.50] | Water [25.00] |
| Comparative Example 18 | (S1)-18 [73.65] | $NH_4F$ [0.45] | TMAF [0.30] | Surfact-W [0.10] | 1-ThioG [0.50] | Water [25.00] |
| Comparative Example 19 | (S1)-19 [73.65] | $NH_4F$ [0.45] | TMAF [0.30] | Surfact-W [0.10] | 1-ThioG [0.50] | Water [25.00] |
| Comparative Example 20 | (S1)-20 [73.65] | $NH_4F$ [0.45] | TMAF [0.30] | Surfact-W [0.10] | 1-ThioG [0.50] | Water [25.00] |
| Comparative Example 21 | (S1)-21 [73.65] | $NH_4F$ [0.45] | TMAF [0.30] | Surfact-W [0.10] | 1-ThioG [0.50] | Water [25.00] |

TABLE 3

| | (S) component | (F) component | (A) component | (B) component | (C) component | (W) component |
|---|---|---|---|---|---|---|
| Example 7 | (S0)-7 [73.65] | $NH_4F$ [0.57] | Surfact-W [0.10] | 1-ThioG [0.50] | HF [0.01] | Water [25.00] |
| Example 8 | (S0)-6 [73.65] | $NH_4F$ [0.57] | Surfact-W [0.10] | 1-ThioG [0.50] | HF [0.01] | Water [25.00] |
| Comparative Example 22 | (S1)-9 [73.65] | $NH_4F$ [0.57] | Surfact-W [0.10] | 1-ThioG [0.50] | HF [0.01] | Water [25.00] |
| Comparative Example 23 | (S1)-5 [73.65] | $NH_4F$ [0.57] | Surfact-W [0.10] | 1-ThioG [0.50] | HF [0.01] | Water [25.00] |
| Comparative Example 24 | (S1)-16 [73.65] | $NH_4F$ [0.57] | Surfact-W [0.10] | 1-ThioG [0.50] | HF [0.01] | Water [25.00] |
| Comparative Example 25 | (S1)-21 [73.65] | $NH_4F$ [0.57] | Surfact-W [0.10] | 1-ThioG [0.50] | HF [0.01] | Water [25.00] |

In Tables 1 to 3, each abbreviation has the following meaning.

NMP: N-Methyl-2-pyrrolidone $NH_4F$: Ammonium fluoride

TMAF; Tetramethylammonium fluoride

Surfact-W: Surfactant W (surfactant; Tokyo Ohka Kogyo Co., Ltd.)

1-ThiG: 1-Thioglycerol (anticorrosive agent)

HF: Hydrofluoric acid

Compositions of the (S) component in Tables 1 to 3 are shown in Tables 4 to 6. In Tables 4 to 6, the numerical values in [ ] indicate % by mass with respect to the total mass of the metal residue removing liquid. The numerical values in ( ) indicate volume ratios converted from densities of individual solvents at 25° C. The Hansen solubility parameter (HSP) of the (S) component is also shown.

TABLE 4

| (S) component | First organic solvent | Second organic solvent | HSP δD | HSP δP | HSP δH | HSP δP-δH |
|---|---|---|---|---|---|---|
| (S1)-1 | DMF [73.65] | — | 17.4 | 13.7 | 11.3 | 2.4 |
| (S1)-2 | DMSO [73.65] | — | 18.4 | 16.4 | 10.2 | 6.2 |
| (S1)-3 | 1MI [73.65] | — | 19.7 | 15.6 | 11.2 | 4.4 |
| (S1)-4 | 2P [73.65] | — | 18.2 | 12 | 9 | 3.0 |
| (S1)-5 | TriEG [73.65] | — | 16 | 12.5 | 18.6 | −6.1 |
| (S1)-6 | TetraEG [73.65] | — | 16.7 | 9 | 14.6 | −5.6 |
| (S1)-7 | DEG [73.65] | — | 16.6 | 12 | 19 | −7.0 |
| (S1)-8 | MEOH [73.65] | — | 14.7 | 12.3 | 22.3 | −10.0 |
| (S1)-9 | DEF [73.65] | — | 16.4 | 11.4 | 9.2 | 2.2 |

TABLE 5

| (S) component | First organic solvent | Second organic solvent | HSP δD | HSP δP | HSP δH | HSP δP-δH |
|---|---|---|---|---|---|---|
| (S0)-1 | DEF [54.13] (59.75) | 2P [19.52] (17.43) | 13.0 | 8.9 | 7.1 | 1.8 |
| (S1)-10 | DEF [22.1] (24.39) | 2P [51.55] (46.03) | 12.4 | 8.3 | 6.4 | 1.9 |
| (S0)-2 | DEF [51.56] (56.90) | 1MI [22.1] (21.45) | 13.6 | 9.8 | 7.6 | 2.2 |
| (S0)-3 | DEF [58.92] (65.03) | 1MI [14.73] (14.30) | 13.5 | 9.6 | 7.6 | 2.1 |
| (S0)-4 | DEF [60.39] (66.66) | DMSO [13.26] (12.05) | 13.1 | 9.6 | 7.4 | 2.2 |
| (S1)-11 | DEF [22.1] (24.39) | DMSO [51.56] (46.87) | 12.6 | 10.5 | 7.0 | 3.4 |
| (S0)-5 | DEF [58.92] (65.03) | TriEG [14.73] (13.39) | 12.8 | 9.1 | 8.5 | 0.6 |
| (S1)-12 | DEF [29.46] (32.52) | TriEG [44.19] (40.17) | 11.8 | 8.7 | 10.5 | −1.7 |
| (S0)-6 | DEF [58.92] (65.03) | TetraEG [14.73] (13.04) | 12.8 | 8.6 | 7.9 | 0.7 |
| (S1)-13 | DEF [29.46] (32.52) | TetraEG [44.19] (39.11) | 11.9 | 7.2 | 8.7 | −1.5 |

TABLE 6

| (S) component | First organic solvent | Second organic solvent | HSP δD | HSP δP | HSP δH | HSP δP-δH |
|---|---|---|---|---|---|---|
| (S1)-14 | DEF [58.92] (65.03) | PG [14.73] (14.16) | 13.0 | 8.9 | 9.0 | −0.1 |
| (S1)-15 | DEF [58.92] (65.03) | EG [14.73] (13.27) | 12.9 | 8.9 | 9.4 | −0.6 |
| (S1)-16 | DEF [58.92] (65.03) | MEOH [14.73] (18.60) | 13.4 | 9.7 | 10.1 | −0.4 |
| (S1)-17 | DEF [44.19] (48.77) | DEG [29.46] (26.30) | 12.4 | 8.7 | 9.5 | −0.8 |
| (S1)-18 | DEF [58.92] (65.03) | DEG [14.73] (13.15) | 12.8 | 9.0 | 8.5 | 0.5 |
| (S1)-19 | TriEG [36.83] (36.83) | TetraEG [36.83] (32.59) | 11.3 | 7.5 | 11.6 | −4.1 |
| (S1)-20 | DMSO [44.19] (44.19) | TetraEG [29.46] (26.07) | 12.5 | 9.6 | 8.3 | 1.3 |
| (S1)-21 | 1MI [14.73] (14.73) | 2P [58.92] (52.61) | 12.5 | 8.6 | 6.4 | 2.2 |
| (S0)-7 | DEF [60.00] (66.23) | 2P [13.65] (12.19) | 16.8 | 11.5 | 9.2 | 2.4 |

In Tables 4 to 6, each abbreviation has the following meaning. Densities of individual solvents at 25° C. are shown in ( ).

DEF: N,N-Diethylformamide (0.906 g/cm$^3$)
DMF: N,N-Dimethylformamide (0.944 g/cm$^3$)
2P: 2-Pyrrolidone (1.12 g/cm$^3$)
1MI: 1-Methylimidazole (1.03 g/cm$^3$)
DMSO: Dimethylsulfoxide (1.1 g/cm$^3$)
MEOH: Methanol (0.792 g/cm$^3$)
DEG: Diethylene glycol (1.12 g/cm$^3$)
TriEG: Triethylene glycol (1.1 g/cm$^3$)
PG: Propylene glycol (1.04 g/cm$^3$)
EG: Ethylene glycol (1.11 g/cm$^3$)
TetraEG: Tetraethylene glycol (1.13 g/cm$^3$)
DEG: Diethylene glycol (1.12 g/cm$^3$)

<Calculation of Hansen Solubility Parameter (HSP)>

In Tables 4 to 6, "HSP" indicates the Hansen solubility parameters of the (S) component. The HSP is obtained by decomposing a solubility parameter (SP value) of Hildebrand into three decomposition terms of a dispersion term (ED), a polar term (δP), and a hydrogen bond term (δH) and representing these terms as a three-dimensional vector.

HSPs of the first organic solvent and the second organic solvent were calculated by HSPiP (pirika.com).

The HSP ($\delta D_m$, $\delta P_m$, ($\delta H_m$) of the (S) component was calculated by the following formulae.

$$\delta D_m = (a*\delta D_1 + b*\delta D_2)/(a+b)$$

$$\delta P_m = (a*\delta P_1 + b*\delta P_2)/(a+b)$$

$$\delta H_m = (a*\delta H_1 + b*\delta H_2)/(a+b)$$

$\delta D_m$, $\delta P_m$, and $\delta H_m$ indicate the HSP of the (S) component.

$\delta D_1$, $\delta P_1$, and $\delta H_1$ indicate the HSP of the first organic solvent.

$\delta D_2$, $\delta P_2$, and $\delta H_2$ indicate the HSP of the second organic solvent.

a and b indicate a volume ratio (first organic solvent: second organic solvent=a:b) of the first organic solvent to the second organic solvent.

<Evaluation of Aluminum Etching Amount>

As a test substrate, a substrate in which an aluminum film was formed on a silicon wafer with a film thickness of 570 nm was used. The metal residue removing liquid of each example was placed in a beaker, and the test substrate was immersed in the metal residue removing liquid and left to stand at 25° C. for 5 minutes. Thereafter, the test substrate was taken out from the metal residue removing liquid, washed with water, and dried in a nitrogen stream. Subsequently, the aluminum film thickness of the test substrate was measured by fluorescent X-ray analysis (ZSX PrimuslV, Rigaku Corporation). The aluminum film thickness was also measured on the test substrate before the treatment with the metal residue removing liquid. The etching amount of aluminum was calculated from the difference in aluminum film thicknesses before and after the treatment with the metal residue removing liquid. The results are shown in Tables 7 to 9 as "Etching amount of Al (nm) [a]".

<Evaluation of Etching Amount of Aluminum Oxide ($Al_2O_3$)>

As a test substrate, a substrate in which an aluminum oxide ($Al_2O_3$) film was formed on a silicon wafer with a film thickness of 250 nm was used. The metal residue removing liquid of each example was placed in a beaker, and the test substrate was immersed in the metal residue removing liquid and left to stand at 25° C. for 5 minutes. Thereafter, the test substrate was taken out from the metal residue removing liquid, washed with water, and dried in a nitrogen stream. Subsequently, the $Al_2O_3$ film thickness of the test substrate was measured by fluorescent X-ray analysis. The $Al_2O_3$ film thickness was also measured on the test substrate before the treatment with the metal residue removing liquid. The etching amount of $Al_2O_3$ was calculated from the difference in the $Al_2O_3$ film thicknesses before and after the treatment with the metal residue removing liquid. The results are shown in Tables 7 to 9 as "Etching amount of $Al_2O_3$ (nm) [b]".

<Evaluation of Metal Residue Removing Performance>

[Treatment I]

A silicon wafer on which an $SiO_2$ layer was formed was used as a substrate. On the substrate, a TiN layer was formed as a first layer, an Al layer was formed as a second layer, and a TiN layer was formed as a third layer. TDUR-P015PM (manufactured by TOKYO OHKA KOGYO CO., LTD.), which is a positive-type photoresist, was applied onto the third layer with a spinner and pre-baked at 80° C. for 90 seconds to form a photoresist layer having a film thickness of 0.7 μm.

This photoresist layer was exposed through a mask pattern with FPA3000EX3 (manufactured by Canon Inc.) and then post-baked at 110° C. for 90 seconds. Subsequently, the layer was developed with a 2.38% by mass tetramethylammonium hydroxide (TMAH) aqueous solution to form a 400 nm wide line-and-space photoresist pattern. Subsequently, by using the photoresist pattern as a mask, a substrate was subjected to a dry etching treatment and furthermore subjected to a plasma ashing treatment.

The substrate on which the above-described treatment I had been performed was immersed in the metal residue removing liquid (25° C., 10 minutes) of each example, and a photoresist stripping treatment was performed thereon. After the stripping treatment, the substrate was rinsed with pure water. Thereafter, the substrate was observed by SEM (scanning electron microscope, scanning electron microscope S-4700, Hitachi High-Tech Corporation), and the residue removing performance was evaluated according to the following evaluation standard. The results are shown in Tables 7 to 9 as "Removing performance".

Evaluation Standard

A: No or a few metal residues were observed.

B: Metal residues were observed on the entire substrate.

TABLE 7

| | Removing performance | Etching amount of Al (nm) [a] | Etching amount of $Al_2O_3$ (nm) [b] | [a] + [b] (nm) | [b]/[a] |
|---|---|---|---|---|---|
| Reference Example | A | 18.4 | 6.7 | 25.1 | 0.4 |
| Comparative Example 1 | DMF was decomposed | — | — | — | — |
| Comparative Example 2 | B | 4.5 | 7.6 | 12.1 | 1.7 |
| Comparative Example 3 | B | 7.6 | 10.2 | 17.8 | 1.3 |
| Comparative Example 4 | B | 5.5 | 8.2 | 13.7 | 1.5 |
| Comparative Example 5 | B | 3.1 | 6.9 | 10.0 | 2.2 |
| Comparative Example 6 | B | 2.9 | 7.3 | 10.2 | 2.5 |
| Comparative Example 7 | B | 3.6 | 6.5 | 10.1 | 1.8 |
| Comparative Example 8 | B | 1.7 | 1.3 | 3.0 | 0.8 |
| Comparative Example 9 | Separated into two layers | — | — | — | — |

TABLE 8

| | Removing performance | Etching amount of Al (nm) [a] | Etching amount of $Al_2O_3$ (nm) [b] | [a] + [b] (nm) | [b]/[a] |
|---|---|---|---|---|---|
| Example 1 | A | 11.5 | 17.4 | 28.9 | 1.5 |
| Comparative Example 10 | Separated into two layers | — | — | — | — |
| Example 2 | A | 18.3 | 17.4 | 35.7 | 1.0 |
| Example 3 | A | 29.6 | 18.7 | 48.3 | 0.6 |
| Example 4 | A | 9.8 | 19.1 | 28.9 | 1.9 |
| Comparative Example 11 | B | 5 | 13.5 | 18.5 | 2.7 |
| Example 5 | A | 5.5 | 16.3 | 21.8 | 3.0 |
| Comparative Example 12 | B | 1.86 | 4.14 | 6.0 | 2.2 |
| Example 6 | A | 12.7 | 19.6 | 32.3 | 1.5 |
| Comparative Example 13 | B | 1.74 | 4.38 | 6.1 | 2.5 |
| Comparative Example 14 | B | 2.9 | 16.2 | 19.1 | 5.6 |
| Comparative Example 15 | B | 1.4 | 15.3 | 16.7 | 10.9 |
| Comparative Example 16 | B | 3.6 | 15.2 | 18.8 | 4.2 |
| Comparative Example 17 | B | 3.6 | 12.2 | 15.8 | 3.4 |
| Comparative Example 18 | B | 4.5 | 13.2 | 17.7 | 2.9 |
| Comparative Example 19 | B | 3 | 7.1 | 10.1 | 2.4 |
| Comparative Example 20 | B | 3.86 | 7.48 | 11.3 | 1.9 |
| Comparative Example 21 | B | 5.92 | 8.6 | 14.5 | 1.5 |

TABLE 9

| | Removing performance | Etching amount of Al (nm) [a] | Etching amount of $Al_2O_3$ (nm) [b] | [a] + [b] (nm) | [b]/[a] |
|---|---|---|---|---|---|
| Example 7 | A | 29.4 | 43.8 | 73.2 | 1.5 |
| Example 8 | A | 26.4 | 45.2 | 71.6 | 1.7 |
| Comparative Example 22 | Separated into two layers | — | — | — | — |
| Comparative Example 23 | B | 5.9 | 12.7 | 18.6 | 2.2 |
| Comparative Example 24 | B | 3.2 | 16.6 | 19.8 | 5.2 |
| Comparative Example 25 | B | 8.5 | 9.3 | 17.8 | 1.1 |

From the results of Tables 7 to 9, it was confirmed that the metal residues were favorably removed in Examples 1 to 8. In addition, the etching amount of Al and the etching amount of $Al_2O_3$ were also favorable. In a case in which the total value ([a]+[b]) of the etching amount of Al and the etching amount of $Al_2O_3$ was 21 nm or more, it was considered that the removing performance with respect to the metal residue was favorable. In all of Examples 1 to 8, ([a]+[b]) was 21 nm or more. From these results, it was confirmed that Examples 1 to 8 have the metal residue removing performance equal to or better than that of the metal residue removing liquid (Reference Example) using NMP in the related art. Examples 1 to 8 tended to have high etching selectivity for $Al_2O_3$ as compared with Reference Example. These results show that the metal residue removing liquid in each of Examples 1 to 8 causes less damage to the metal wiring than the metal residue removing liquid containing NMP in the related art.

On the other hand, in Comparative Example 1, DMF in the metal residue removing liquid was decomposed. In addition, in each of Comparative Examples 9, 10, and 22, the metal residue removing liquid was separated into two layers. Therefore, these metal residue removing liquids could not be used for evaluation. All of the metal residue removing liquids of the other Comparative Examples had poor metal residue removing performance. The total value ([a]+[b]) of the etching amount of Al and the etching amount of $Al_2O_3$ was less than 21 nm in all of the metal residue removing liquids of the other Comparative Examples.

While preferred embodiments of the invention have been described and illustrated above, it should be understood that these are exemplary of the invention and are not to be considered as limiting. Additions, omissions, substitutions, and other modifications can be made without departing from the scope of the invention. Accordingly, the invention is not to be considered as being limited by the foregoing description and is only limited by the scope of the appended claims.

What is claimed is:

1. A metal residue removing liquid, comprising:

a mixed solvent (S0) that contains a first organic solvent (S1) and a second organic solvent (S2);

a salt (F) of a base containing no metal ions and hydrofluoric acid; and water, wherein the first organic solvent (S1) is diethylformamide, the mixed solvent (S0) has a value of 0.6 or more, which is obtained by subtracting a hydrogen bond term (δH) of a Hansen solubility parameter from a polar term (δP) of a Hansen solubility parameter, and a content of the first organic solvent (S1) is 40 to 70% by mass with respect to the total mass of the metal residue removing liquid.

2. The metal residue removing liquid according to claim 1, wherein a content of the second organic solvent (S2) is 10 to 30% by mass with respect to the total mass of the metal residue removing liquid.

3. The metal residue removing liquid according to claim 1, wherein the metal residue contains at least one selected from the group consisting of aluminum, copper, titanium, nickel, ruthenium, tungsten, cobalt, and oxides thereof.

4. A metal residue removing method, comprising bringing the metal residue removing liquid according to claim 1 into contact with a process object.

5. The metal residue removing method according to claim 4, wherein the process object includes metal wiring.

6. A metal wiring manufacturing method, comprising:

etching a metal layer of a substrate that includes the metal layer to form metal wiring; and bringing the metal residue removing liquid according to claim 1 into contact with the etched substrate.

7. The metal residue removing liquid according to claim 1, wherein a content of the mixed solvent (S0) is 60 to 80% by mass with respect to the total mass of the metal residue removing liquid.

8. The metal residue removing liquid according to claim 1, wherein a content of the mixed solvent (S0) is 60 to 75% by mass with respect to the total mass of the metal residue removing liquid.

9. The metal residue removing liquid according to claim 1, wherein a content of the first organic solvent (S1) is 50 to 65% by mass with respect to the total mass of the metal residue removing liquid.

* * * * *